United States Patent [19]
Kleimola et al.

[11] 3,982,666
[45] Sept. 28, 1976

[54] FINE TIMING APPARATUS FOR ELECTRONIC DETERGENT DISPENSING SYSTEM

[75] Inventors: David L. Kleimola; Marcus I. Nystuen, both of St. Paul; David L. Nystuen, Bloomington, all of Minn.

[73] Assignee: Economics Laboratory, Inc., St. Paul, Minn.

[22] Filed: Mar. 24, 1975

[21] Appl. No.: 561,373

Related U.S. Application Data

[62] Division of Ser. No. 335,136, Feb. 23, 1973, Pat. No. 3,881,328, which is a division of Ser. No. 210,669, Dec. 22, 1971, abandoned.

[52] U.S. Cl. .................................. 222/70; 68/17 R
[51] Int. Cl.² .......................................... D06F 39/02
[58] Field of Search .............. 222/70; 68/17 R, 207, 68/12 R; 134/57 D, 57 R, 93

[56] References Cited
UNITED STATES PATENTS

3,043,478   7/1962   Adams et al. ......................... 222/70
3,408,036   10/1968   Smith et al. .......................... 222/70

*Primary Examiner*—Stanley H. Tollberg
*Assistant Examiner*—John P. Shannon
*Attorney, Agent, or Firm*—Merchant, Gould, Smith, Edell, Welter & Schmidt

[57] ABSTRACT

A detergent dispensing system for sequentially and automatically injecting various liquid products (e.g., detergents, fabric conditioners, neutralizers, etc.) into a laundry washing machine. Each liquid product is independently connected to a venturi-aspirator positioned within separate carrier fluid conduits (e.g. water conduits) and the product is drawn into the respective carrier fluid conduits upon passage of carrier fluid therethrough. Electrical control circuitry, including electrical timing apparatus, triggered by a signaling device synchronized with the machine washing cycle selectively actuates and deactuates a solenoid-operated valve positioned upstream of each venturi-aspirator so as to allow injection into the carrier fluid of a predetermined quantity of each liquid product at the desired point in the machine cycle.

4 Claims, 3 Drawing Figures

FINE TIMING APPARATUS FOR ELECTRONIC DETERGENT DISPENSING SYSTEM

CROSS REFERENCE TO RELATED APPLICATIONS

This is a division of application Ser. No. 335,136, filed on Feb. 23, 1973, now U.S. Pat. No. 3,881,328, of David L. Kleimola et al for "Electronic Detergent Dispensing System", which was a division of application Ser. No. 210,669, filed on Dec. 22, 1971 of David L. Kleimola et al for "Electronic Detergent Dispensing System", now abandoned.

BACKGROUND OF THE INVENTION

1. Field of the Invention

The present invention pertains to a system for automatically dispensing predetermined quantities of a plurality of liquid products.

2. Description of the Prior Art

It is frequently necessary to selectively dispense a plurality of fluid products into the carrier fluid utilized in various operations and processes. For example, a wide variety of liquid detergents, laundry soaps, iron control agents, neutralizers, etc., are frequently injected into the water utilized in machine clothes washers, dishwashers, etc. This is particularly true for the laundry operation in large commercial institutions (e.g., hotels, restaurants, hospitals, etc.). Since entirely manual dispensing of the various laundry products is uneconomical and unreliable in a commercial environment, numerous attempts have been made to provide either semi-automatic or automatic dispensing of the liquid products.

The presently available semi-automatic dispensing units operate on a load-by-load basis. The amount of each liquid product (or powdered product) necessary to provide the desired cleansing action, neutralizing action, etc., for a single laundry load is measured out and positioned within separate receptacles associated with the laundry machine. In response to an electrical signal generated by the machine, wash water is selectively channeled through one or more of the receptacles at the appropriate time during the machine washing cycle and the product is injected into the washer. The product receptacles are then refilled for the next load. While such semi-automatic apparatus is generally more dependable than entirely manual dispensing, this type of apparatus is still subject to human error in measuring the proper amount of product for each load as well as the proper placement of the products (i.e., placement of each product within the correct receptacle).

The automatic dispensing unit eliminates the necessity of manually measuring the laundry products and manually adding the measured products to the machine at the completion of each washing cycle. However, the presently available apparatus is exceedingly expensive and does not produce as accurate dispensing as is desirable. For instance, one commercially available unit utilizes the conventional formula chart control so as to electrically actuate and deactuate a plurality of pressurized containers containing liquid products and a plurality of product valves to allow selective dispensing of the liquid products. To accomplish this, a hole is cut into the formula chart (i.e., a plastic tape) at an appropriate position and, during the passage of this hole past a pressure sensitive (vacuum) switch, the pressurized tanks are activated to allow dispensing of one or more of the liquid products, However, to dispense the desired amount of each liquid product necessitates extreme accurateness in the cutting of the holes within the formula chart and in the method of controlling and maintaining the desired pressure requirements. The proper control of these variables has proven exceedingly difficult and, consequently, this type of apparatus has not provided as accurate dispensing as is desirable. A further disadvantage of this type of apparatus is the need to transfer the powdered and/or liquid products from their shipping containers into separate high pressure containers for dilution with water and subsequent injection into the laundry machine. Thus, while apparatus is presently available which incorporates the wash cycle and product dispensing system into one system, this apparatus is exceedingly expensive and generally unreliable. Alterntive injection timing apparatus, such as a cam-operated timer, is neither dependable nor readily adjustable.

SUMMARY OF THE INVENTION

Our invention utilizes a signal generating device for generating electrical triggering signals having a predetermined duration. These triggering signals are received by electric control means which, upon receiving the triggering signal, selectively operates one of a plurality of product injection means to allow injection of a particular product into a carrier fluid. The control means includes timing apparatus for generating a control signal to deactuate the injection means prior to the termination of the triggering signal. The dispensing system finds a highly desirable application in conjunction with institutional laundry machines. In the preferred embodiment, a plurality of liquid product containers are each independently connected to a venturi-aspirator positioned within separate conduits for providing wash water to the laundry machine. The electrical control apparatus operates a solenoid-operated valve positioned upstream of each of the venturi-aspirators thereby controlling the injection of the liquid products through the respective venturi-aspirators and into the water conduit.

The present invention provides several significant advantages which are not found in the liquid detergent dispensing units heretofore available. First, it is entirely automatic, yet highly accurate in operation and inexpensive to construct. The unreliability and inaccurateness of the prior art dispensing units is substantially overcome by the electrical timing apparatus for timing the period during which each liquid product is injected into the laundry machine. This timing apparatus eliminates the necessity of relying on the duration of a signal generated by the laundry machine (e.g. by an electronic formula chart) to regulate product injection. Rather, by properly calibrating the adjustable timing apparatus, highly accurate and dependable dispensing of a plurality of liquid detergents can be provided independent of the duration of the initial triggering signal. For instance, utilizing the present invention the timing interval for injecting products is regulatable and repeatable well within one second intervals, whereas the timing interval of prior art systems typically varies from about ± 3 seconds to about ± 8 seconds. Additionally, the reliability of our detergent dispensing system is not affected by contaminants (e.g., lint, burrs, etc.) which frequently interfere with the reliable operation of the prior art systems. This is a particularly important feature when the total product feed time is relatively short (e.g. 3 seconds). Finally, the utilization of venturi-aspirators in the preferred embodiment to inject the product into the water conduit eliminates the need to utilize relatively costly high pressure apparatus for effecting dispensing of the various liquid products into the washing machine. It has also been found that by the proper choice of the venturi orifice size as well as the setting for the electrical timing apparatus, highly precise regulation of the quantities of liquid products injected into a carrier fluid can be achieved.

DETAILED DESCRIPTION OF THE PREFERRED EMBODIMENT

Figure 1:
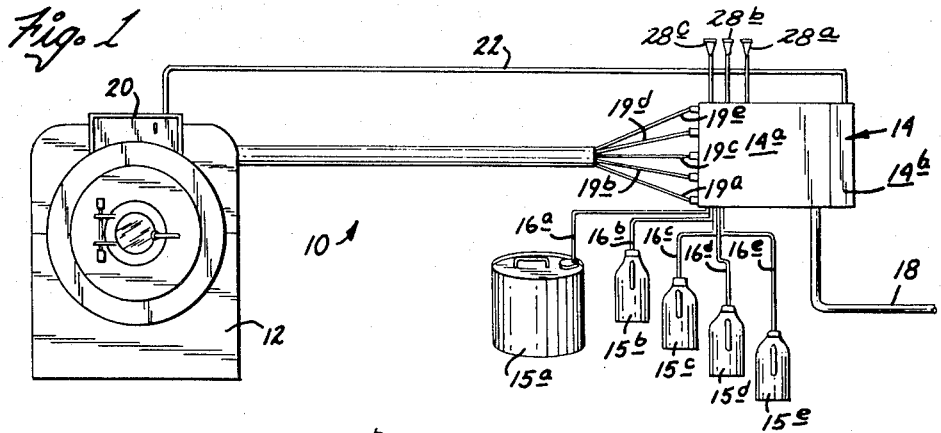
FIG. 1 is a diagrammatic view of the present liquid detergent dispensing system.

Referring now to the drawings and particularly to FIG. 1, the numeral 10 generally designates the system provided by the present invention for injecting a plurality of liquid products into a washing machine 12. The illustrated washing machine 12 is a laundry washing machine of the type commonly utilized in various commercial institutions. It should be undertood, however, that the term washing machine is used herein to generally designate diswashing machines, laundry washing machines and similar batch processing apparatus. Furthermore, the present dispensing system can find numerous additional applications in conjunction with various apparatus and processes in which it is desired to sequentially inject a precisely controlled amount of a plurality of liquid products.

As can be seen in FIG. 1, the dispensing system 10 includes control apparatus 14 having a mechanical portion 14a and an electrical portion 14b. As described subsequently in greater detail, the control apparatus 14 controls the injection of various liquid products (e.g., detergents, laundry soaps, stain removing agents, fabric conditioners, neutralizers, iron control agents, etc.) into the laundry machine 12. As shown, the various liquid products are contained within suitable receptacles or containers 15a –15e and conveyed to control apparatus 14 by liquid product conduits 16a–16e respectively. Preferably, conduits 16a–16e are adapted for connecting directly to a bung hole in the respective one of the liquid product receptacles 15a–15e. This eliminates the necessity of transferring each liquid product from the shipping container to a container suitable for utilization during the dispensing operation. As subsequently explained, the liquid product conduits 16a–16e are connected within the mechanical portion 14a of the control apparatus 14 to conduit means 18 suitable for conducting a carrier liquid (e.g., water) therethrough. A plurality of conduits 19a–19e connect the control apparatus 14 to the washing machine 12 for conducting therethrough mixtures of the various liquid products and liquid carrier. Finally, a trigger signal generating means 20 is associated with the washing machine 12 and synchronized therewith so as to generate electrical triggering signals at predetermined times during the washing machine cycle. The trigger signal generating device is electrically connected to the electrical portion 14b of control apparatus 14 by electrical conduit means 22.

Figure 2:
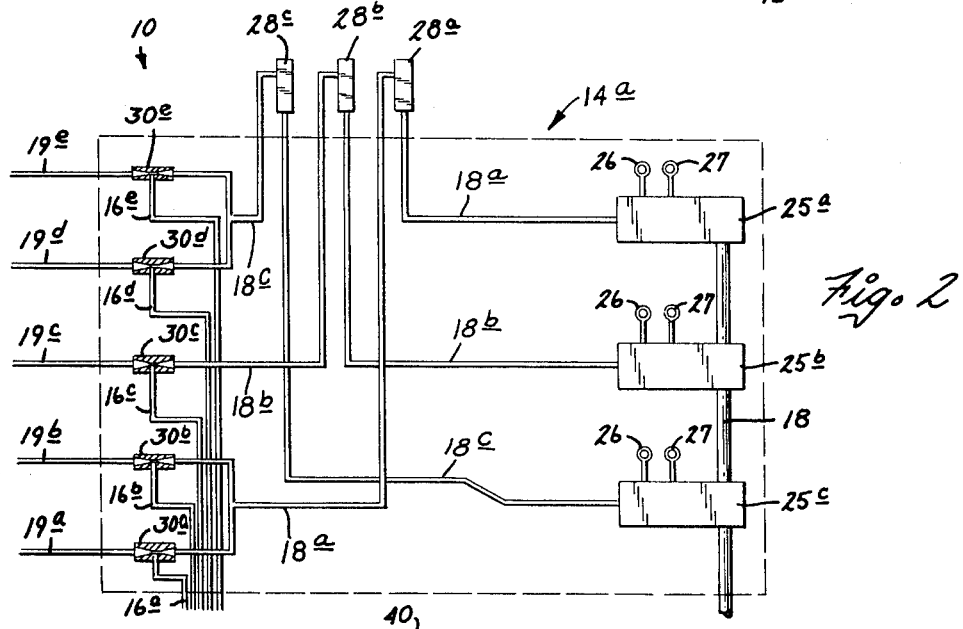
FIG. 2 is an enlarged diagrammatic view of the mechanical portion of the liquid product injectio apparatus utilized in the dispensing system illustrated in FIG. 1.

The mechanical portion 14a of control apparatus 14 can be best appreciated with reference to FIG. 2. As shown, the water conduit 18 has positioned therein a plurality of electrically actuated valve means 25a, 25b and 25c. A pair of electrical terminals 26 and 27 are provided for electrically connecting each of the valves 25a–25c to electrical control apparatus 14b so as to allow independent actuation and deactuation of the respective valves. This controls the flow of water through the conduits 18a–18c which are connected to the downstream side of valves 25a–25c, respectively. A siphon breaker 28a, 28b and 28c is positioned within each of the branch conduits 18a–18c, respectively, so as to prevent liquid product from entering the respective conduits 18a–18c in the case of a negative pressure therein. Downstream of the siphon breaker 28a, the conduit 18a T's or separates into a pair of conduits 19a and 19b. Similarly, the conduit 18c T's or separates into a pair of conduits 19d and 19e. This allows injection of a greater number of liquid products or, alternatively, a greater amount of the same product. However, the conduits 18a–18c can be connected to any number of conduits (e.g. conduit 18b is connected to a single conduit 19c) dependent on the number of liquid products which are to be independently and simultaneously injected into the washing machine 12. Finally, venturi means in the form of venturi-aspirators 30a–30e are positioned within each of the conduits 19a–19c, respectively. As shown, the venturi-aspirators 30e–30e are connected to the liquid product conduits 16a–16e, respectively, for drawing the various liquid products housed within containers 15a–15e through the respective conduits 16a–16e and injecting the liquid product into the conduits 19a–19e upon flow of the carrier liquid therethrough. The operational principle of venturi-aspirators is well known and need not be described in detail. In this same regard, the size and drawing capacity of each of the venturies 30a–30e are not critical to the present invention and the selection of appropriate venturi-aspirators and metering tips to provide the desired injection rate is within the skill of the artisan. As will subsequently become apparent, valve means 25a–25c and venturi-aspirators 30a–30e function as electrically actuated injection or pump means for allowing injection of the fluid products into the carrier fluid upon actuation thereof. It should be understood, however, that other types of injection means such as a conventional electromechanical pump can be utilized in place of solenoid valves 25a–25c and venturi-aspirators 30a–30e.

Figure 3:
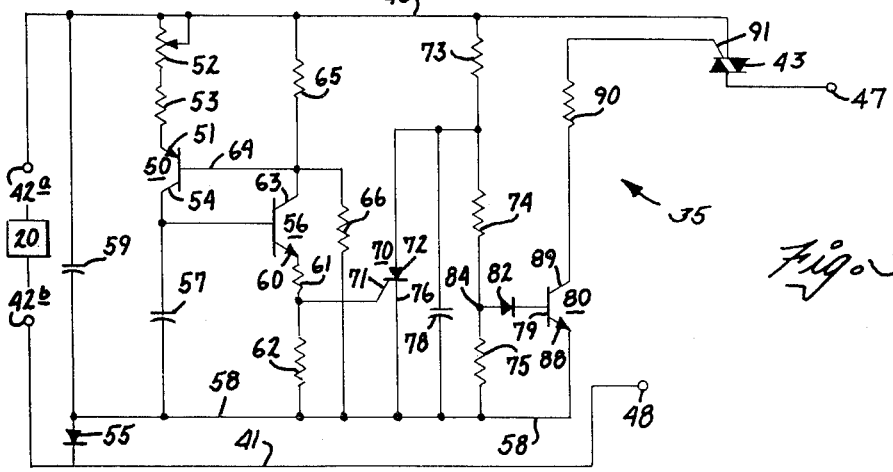
FIG. 3 is a schematic diagram of the electronic circuitry utilized to operate the valving means shown in FIG. 2.

Electrical control apparatus 14b is provided to independently actuate the control valves 25a–25c. The electrical apparatus 14b includes separate circuitry for controlling each of the valves 25a–25c. One such circuit (e.g., for controlling valve 25a) is shown in FIG. 3 and is generally designated 35. Similar circuits (not shown) are provided for the remaining two valves (i.e., valves 25b and 25c). These circuits are similar to the circuitry shown in FIG. 3 with the possible exception of the component values used therein.

As shown, the electrical circuitry 35 includes a pair of leads 40 and 41 which are connected to the terminals 42a and 42b of trigger signal generator means 20. Positioned in series in lead 40 are a triac 43 and a terminal 47. Lead 41 is connected directly to a terminal 48. The terminals 47 and 48 are connected to the terminals 26 and 27 of valve 25a by suitable electrical leads (not shown).

A PNP transistor 50 has its emitter 51 connected to the lead 40 through a potentiometer 52 and a resistor 53. The collector 54 of transistor 50 is connected to the base of an NPN transistor 56 and through a capacitor 57 to a lead 58. The lead 58 is connected through a diode 55 to the lead 41. Diode 55 and series capacitor 59 provide rectification and filtering of the a-c voltage between leads 40 and 41. The potentiometer 52, resistor 53, transistor 50 serve as a variable resistance charging network for capacitor 57 forming a resistance-capacitance (RC) network. The potential across capacitor 57 provides the firing point for the transistor 56. The transistor 50 is a generally constant current device providing an essentially constant charging rate for capacitor 57. This provides for a more linear time adjustment for the firing of transistor 56.

The emitter 60 of transistor 56 is connected to the lead 58 through a pair of resistors 61 and 62. The collector 63 of the transistor 56 is connected to the base 64 of transistor 50 and to the lead 40 through a resistor 65. Collector 63 is also connected to the lead 58 through a resistor 66. The pair of resistors 61 and 62 provide the emitter bias for the transistor 56. A silicon-controlled-rectifier (SCR) 70 has its gate 71 connected between resistors 61 and 62. The anode 72 of SCR 70 is connected through a resistor 73 to the lead 40 and through a pair of resistors 74 and 75 to the lead 58. The cathode 76 of SCR 70 is connected directly to the lead 58. A capacitor 78 shunts the anode 72 and cathode 76 of SCR 70. The resistors 73, 74 and 75 function as a voltage divider network for providing the voltage to the base 79 of an NPN transistor 80. As shown, NPN transistor 80 has its base 79 connected through a diode 82 to a junction point 84 between resistors 74 and 75. The emitter 88 of transistor 80 is connected directly to lead 58. Finally, the collector 89 of transistor 80 is connected through a resistor 90 to the gate 91 of the triac 43. The values of the resistors 73, 74 and 75 (i.e., the voltage divider network) are chosen so that upon the occurrence of a triggering signal at terminals 42a and 42b, the transistor 80 is switched to a conducting state and, consequently, biasing triac 43 to a conducting state. Thus, the triggering voltage occurs at terminals 26 and 27 of valve 25a and thereby actuating the valve 25a instantaneously with the occurrence of the triggering signal at terminals 42a and 42b. Circuitry illustrated in FIG. 3 functions as a timing network to provide a control signal for deactuating valve 25a prior to the termination of the triggering signal at terminals 42a and 42b.

For a triggering signal of 24 volts magnitude, the following component values have been utilized:

| Resistors | Value |
| --- | --- |
| 45 | 3,900 ohms |
| 52 | 100,000 |
| 53 | 2,700 |
| 61 | 10,000 |
| 62 | 560 |
| 65 | 1,000 |
| 66 | 22,000 |
| 73 | 2,000 |
| 74 | 820 |
| 75 | 560 |
| 90 | 470 |

| Capacitors | Value |
| --- | --- |
| 59 | 100 micro farads |
| 57 | 100 |
| 78 | 0.01 |

| Semiconductor Components | Type |
| --- | --- |
| 43 | A01002 |
| 50 | 2N4402 |
| 56 | 2N3417 |
| 70 | 2N5061 |
| 80 | 2N3417 |

The operation of the present invention can be described as follows. When it is desired to inject various liquid products into washing machine 12 at predetermined times during the machine cycle, the trigger signal generating means 20 is synchronized with the machine cycle so as to provide triggering signals to electrical apparatus 14b which, in turn, transmits a control signal to the appropriate one(s) of the valves 25a–25c at the desired times. These triggering signals can be generated, for example, by cam-operated switches or the passage of a punched formula chart past properly positioned micro switches or pressure-sensitive switches. However, for reasons which will subsequently become apparent, our invention is unlike the dispenser units heretofore available in that the duration of the triggering signal is no longer of critical importance. Rather, the length of the injection period is independent of the duration of the triggering signal.

Upon the occurrence of a triggering signal at terminals 42a and 42b, the transistor 80 is switched to a conducting state. This in turn biases triac 43 into a conducting state resulting in an actuating or control signal appearing at terminals 26 and 27 of valve 25a. This signal actuates valve 25a allowing water to flow therethrough and into the conduits 18a. The passage of water through the venturi-aspirators 30a and 30b draws the liquid products within the respective receptacles 15a–15b through the conduits 16a and 16b and injects the products into the carrier fluid flowing through the conduits 19a and 19b. The mixture of liquid product and carrier fluid is then introduced into washing machine 12 through the conduits 19a and 19b.

The occurrence of a triggering signal at terminals 42a and 42b causes the capacitor 57 to begin charging through the RC charging network comprising potentiometer 52, resistor 53, transistor 50. Upon the voltage across capacitor 57 reaching the firing point of transistor 56 (e.g., about 12 volts), the transistor 56 is switched to a conducting state. This biases SCR 70 into a conducting state shunting resistors 74 and 75 and switching transistor 80 to a non-conducting state. Capacitor 78 acts as an a-c shunt to prevent improper triggering of SCR 70 from noise or transients. Upon the switching of transistor 80 to a non-conducting state, the triac 43 is switched to an off state and remains in a non-conducting state so long as the triggering signal is present at terminals 42a and 42b. This deactuates the valve 25a. Upon the termination of the triggering signal from trigger signal operating means 20, the electrical circuitry automatically resets itself.

Thus, it can be seen that by varying the resistance of potentiometer 52, the time required to charge capacitor 57 for firing transistor 56 is also varied. This allows ready adjustment of the time period during which power is supplied to the valve 25a, and, consequently, of the time period during which liquid products are drawn into the conduits 19a and 19b and carried along by the water flowing therethrough until injected into the washing machine 12. As can be readily appreciated, by the proper choice of component values and by adjustment of potentiometer 52, the time period during which liquid product is injected into machine 12 is variable over the entire period of duration of the triggering signal from trigger signal generating means 20. While the maximum duration of the injection period in the described embodiment is limited by the duration of the triggering signal, it should be understood that by use of conventional electrical components (e.g. holding coil relays) the injection of products can be made to continue after the termination of the triggering signal. It should also be appreciated that it may be desirable to choose different component values for the timing circuitry utilized to deactuate valves 25b and 25c than was the case for valve 25a.

Since the present invention has been described in conjunction with a preferred embodiment thereof, numerous modifications thereto will be readily apparent to the artisan. For example, as mentioned previously, numerous signal generating means can be utilized to provide properly timed triggering signals synchronized with the machine cycle. Also, numerous design changes can be made to allow injection of a greater or lesser number of products as well as different quantities of each product. This being the case, it is our intent to be limited solely by the spirit and scope of the appended claims.

What is claimed is:

1. In laundry apparatus, a fine timer adapted to be intercalated between a primary coarse timer, which gives an electrical control signal, and a laundry additive injection means energized thereby, to render the injection interval terminable independently of the continuation of the control signal, comprising, in combination:
   switching means normally conducting the control signal from said coarse timer to said injection means to initiate operation thereof;
   electronic timing means connected to receive said control signal for giving a second signal at a predetermined interval after the reception of said control signal, said second signal thereafter continuing as long as said control signal;
   and means connecting said electronic timing means to said switching means to cause and continue interruption of the supply of said control signal to said additive injection means,
   so that injection of additive is initiated by the initiation of said control signals, and is terminated by the initiation of said second signal even though said control signal is continuing.

2. The apparatus of claim 1 in which the electronic timer includes a resistance-capacitance network and a transistor circuit for discharging the network when the potential thereacross reaches a predetermined value.

3. The apparatus of claim 2 in which the network includes a variable component.

4. The apparatus of claim 3 in which the variable component is an electrical resistance member.

* * * * *